US012761295B2

(12) United States Patent
Dounia et al.

(10) Patent No.: US 12,761,295 B2
(45) Date of Patent: Oct. 13, 2026

(54) MAGNETORESISTIVE ELEMENT HAVING AN OUT-OF-PLANE SENSITIVITY AXIS AND HAVING REDUCED HYSTERESIS AND INCREASED WORKING FIELD RANGE

(71) Applicant: Allegro MicroSystems, LLC, Manchester, NH (US)

(72) Inventors: Salim Dounia, Grenoble (FR); Andrey Timopheev, Vif (FR); Nikita Strelkov, Meylan (FR)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 19/156,467

(22) PCT Filed: Feb. 13, 2024

(86) PCT No.: PCT/IB2024/051324

§ 371 (c)(1),
(2) Date: Aug. 14, 2025

(87) PCT Pub. No.: WO2024/171048

PCT Pub. Date: Aug. 22, 2024

(65) Prior Publication Data

US 2026/0227465 A1 Aug. 6, 2026

(30) Foreign Application Priority Data

Feb. 17, 2023 (EP) .................................... 23315034

(51) Int. Cl.

*G01R 33/09* (2006.01)
*G01R 33/00* (2006.01)
*H10N 50/10* (2023.01)

(52) U.S. Cl.

CPC ....... *G01R 33/093* (2013.01); *G01R 33/0017* (2013.01); *G01R 33/0052* (2013.01); *G01R 33/098* (2013.01); *H10N 50/10* (2023.02)

(58) Field of Classification Search

None
See application file for complete search history.

(56) References Cited

U.S. PATENT DOCUMENTS 7,898,849 B2 * 3/2011 Clinton ............... G11C 11/1673 365/158
9,461,586 B2 * 10/2016 Locatelli ............. H03C 3/0958

(Continued)

FOREIGN PATENT DOCUMENTS

| | | | |
|---|---|---|---|
| CN | 203932116 | U | 11/2014 |
| EP | 4 012 431 | A1 | 6/2022 |
| KR | 2009-0063625 | A | 6/2009 |

OTHER PUBLICATIONS

European Intention to Grant dated Feb. 17, 2025 for European Application No. 23315034.1; 8 Pages.

(Continued)

*Primary Examiner* — William J Klimowicz
(74) *Attorney, Agent, or Firm* — DALY, CROWLEY, MOFFORD & DURKEE, LLP

(57) ABSTRACT

Magnetoresistive element (20) for sensing an external magnetic field, comprising a tunnel barrier layer (22) sandwiched between a ferromagnetic reference layer (21) having a pinned reference magnetization (210), and a ferromagnetic sense layer (23) having a sense magnetization (230), wherein the reference, tunnel barrier, and sense layers (21, 22, 23) are stacked perpendicular to a layer plane ($P_L$) thereof. The reference magnetization (210) is oriented substantially perpendicular to the layer plane ($P_L$), and the sense magnetization (230) is oriented substantially parallel to the layer plane ($P_L$). At least the sense layer (23) has an annular (Continued)

Figure 1:
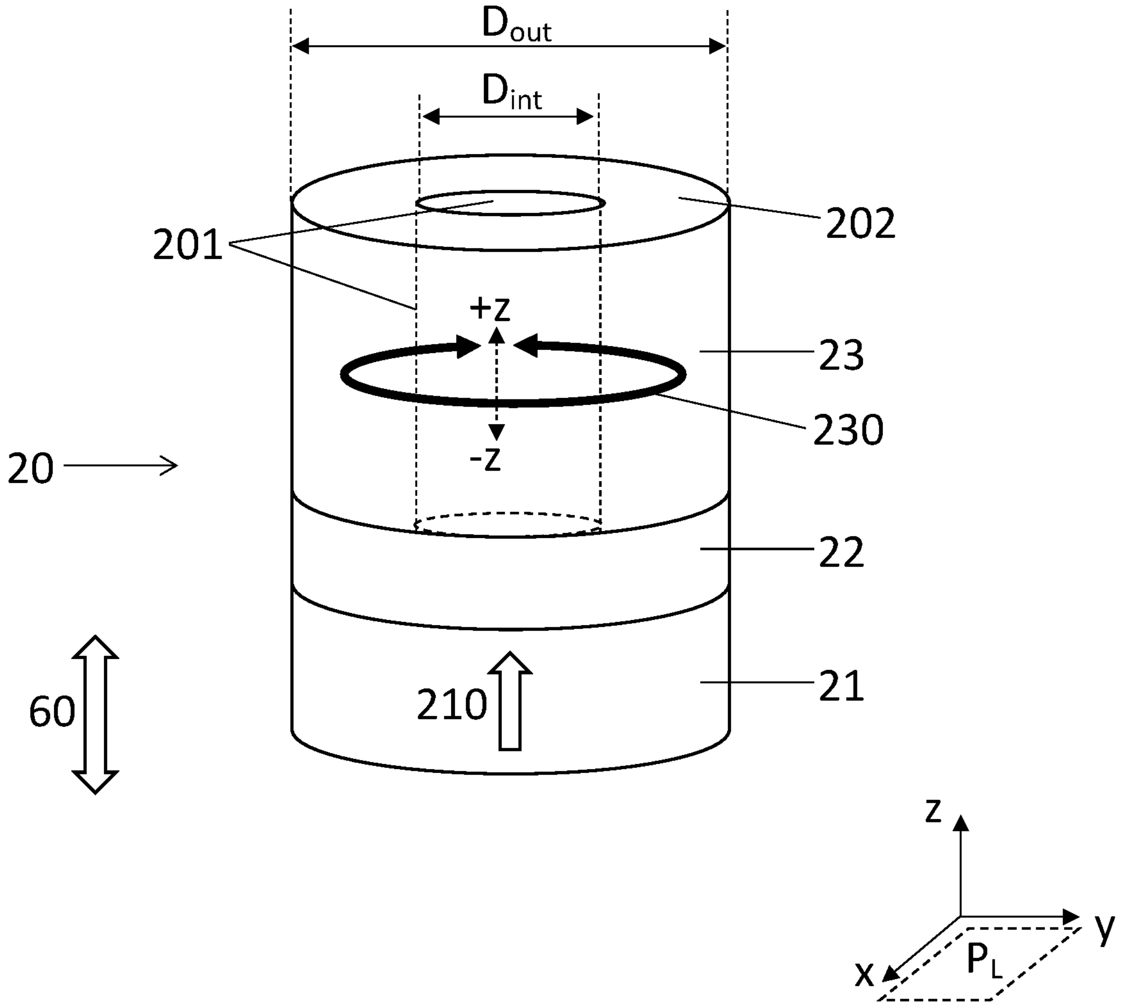

cross-section in the layer plane ($P_L$), with an inner diameter ($D_{int}$) and an outer diameter ($D_{out}$). The sense magnetization (230) has a closed flux path configuration that is orientable either in the clockwise or counterclockwise direction. The inner diameter ($D_{int}$t) is larger than 300 nm, and a difference between the inner and outer diameters ($D_{int}$, $D_{out}$) is greater than 150 nm.

11 Claims, 4 Drawing Sheets

(56) References Cited

U.S. PATENT DOCUMENTS 9,841,266 B2 12/2017 Lombard et al.
9,983,275 B2 5/2018 Bandiera
9,989,599 B2 6/2018 Bandiera
11,289,644 B2 * 3/2022 Jabeur .................... H10N 50/80
11,860,250 B2 1/2024 Timopheev
12,204,005 B2 1/2025 Childress et al.
12,320,870 B2 6/2025 Jaiswal et al.
12,320,873 B2 6/2025 Childress et al.
12,347,595 B2 7/2025 Jaiswal
12,360,183 B2 7/2025 Childress et al.
12,483,244 B2 11/2025 Castro Lisboa
12,546,836 B2 2/2026 Lassalle-Balier et al.
2004/0021539 A1 * 2/2004 Bland .................. G11B 5/4946
2004/0213039 A1 * 10/2004 Kawabata ............. G11C 11/155 365/158
2008/0068753 A1 * 3/2008 Biskeborn .............. G11B 5/584
2009/0244957 A1 * 10/2009 Clinton .................... G11C 5/02 365/158
2011/0110147 A1 * 5/2011 Clinton ............... G11C 11/1673 365/158
2012/0075031 A1 * 3/2012 Dieny .................... H10N 50/10 331/157
2017/0236570 A1 8/2017 Kent et al.
2020/0105325 A1 * 4/2020 Tzoufras ............... G11C 11/155
2020/0105326 A1 * 4/2020 Tzoufras ............... G11C 11/155
2023/0176149 A1 * 6/2023 Lai ........................ H01F 41/303 257/421
2024/0027551 A1 * 1/2024 Childress ............ H01F 10/3272
2024/0395448 A1 * 11/2024 Strelkov ............. H01F 10/3254
2025/0004073 A1 1/2025 Strelkov et al.
2025/0085365 A1 3/2025 Dounia et al.
2025/0164585 A1 5/2025 Campiglio et al.
2025/0372300 A1 12/2025 Ducruet
2025/0383414 A1 12/2025 Dounia et al.
2026/0003017 A1 1/2026 Strelkov et al.
2026/0050051 A1 2/2026 Dounia et al.
2026/0063735 A1 * 3/2026 Belin ................. G01R 33/0052

OTHER PUBLICATIONS

PCT International Search Report and Written Opinion dated May 10, 2024 for International Application No. PCT/IB2024/051324; 13 Pages.

* cited by examiner

MAGNETORESISTIVE ELEMENT HAVING AN OUT-OF-PLANE SENSITIVITY AXIS AND HAVING REDUCED HYSTERESIS AND INCREASED WORKING FIELD RANGE

CROSS REFERENCE TO RELATED APPLICATIONS

This application is a U.S. National Stage Application of International Patent Application No. PCT/IB2024/051324 filed on Feb. 13, 2024, which is based upon and claims the benefit of priority to European Patent Application No. 23315034.1, filed on Feb. 17, 2023, in the European Patent Office. The disclosures of the above-listed applications are incorporated by reference herein in their entireties.

FIELD

The present invention concerns a magnetoresistive element comprising a sense layer, for measuring an external magnetic field along an axis substantially perpendicular to the plane of the sense layer.

BACKGROUND

Magnetic sensors are widely used in cell phones and other mobile devices as electronic compass. For a two-dimensional external magnetic field in an X-Y plane, measurement of the X and Y components of the external magnetic field within the plane may be implemented by using two orthogonal sensors. For the measurement on the external magnetic field in a Z-axis direction, a separate single-axis planar magnetoresistive sensor arranged perpendicular to a two-axis planar sensor can be used. This solution requires assembling two different sensors, the X-Y two-axis magnetoresistive sensor and the Z-axis magnetoresistive sensor.

The external magnetic field in a Z-axis direction canal can further be measured by using a flux guide to convert an external magnetic field from the Z-axis direction into magnetic field components in the X- and Y-axis directions. For example, document US2012206137 discloses a singlechip three-axis AMR sensor, which implements measurement of an external magnetic field in the Z-axis direction by placing a flux guide above in-plane sensors. In such a solution, the external magnetic field in the Z-axis direction is not fully converted into the X- and Y-axis directions. Moreover, such sensor design needs to use a specific algorithm for calculating the external magnetic field in the Z-axis direction, which makes the sensor design more complicated.

Another solution for measuring an external magnetic field in a Z-axis direction includes using magnetic materials with perpendicular magnetic anisotropy. For example, document US20130168787 discloses a magnetic sensor which measures a Z-axis component of an external magnetic field by using a perpendicular magnetic anisotropy material.

In the European Patent Application No. EP4012431, the present applicant discloses a magnetoresistive element for measuring a Z-axis component of an external magnetic field (or having an out-of-plane (OOP) sensitivity axis). The magnetoresistive element comprises a reference layer having a reference magnetization that is fixed and oriented substantially perpendicular to the plane of the reference layer. The magnetoresistive element further comprises a tunnel barrier layer and a sense layer having a free sense magnetization that has a vortex configuration in the absence of an external magnetic field. The vortex configuration is substantially parallel to the plane of the sense layer and has a vortex core magnetization direction along an out-of-plane axis substantially perpendicular to the plane of the sense layer.

However, the magnetoresistive element having an OOP sensitivity axis shows a non-negligible hysteresis that originates from the vortex core polarity switching which happens at high fields. The magnitude of the hysteresis and the vortex core switching field depends on the size of the vortex core, the geometry of the magnetoresistive element, and the magnetic material constituting the sensing layer. The magnitude of the hysteresis can reach 5 to 10 mT. The magnitude of the hysteresis can increase after the magnetoresistive element has been exposed to a high magnetic field (above the vortex core switching field). Consequently, the magnetoresistive element may have poor accuracy, reproducibility, and repeatability in operation.

Moreover, in the magnetoresistive element with the sense magnetization comprising a vortex configuration, different conductivity levels for different vortex core polarities may occur. In the case the reference layer comprises a synthetic antiferromagnet (SAF), the different core polarities will induce different conductivity levels. A larger or smaller conductivity of the magnetoresistive element is obtained when the vortex core and the reference magnetization are, respectively, in the same or opposite directions. A temperature increase results in a decrease in the core polarity switching field which, in turn, leads to a hysteresis appearing at smaller field exposure. This results in a reduced working range of the magnetoresistive element. In order to obtain a good accuracy and reproducibility of the electric response provided by the magnetoresistive element, the latter should be used in external magnetic fields that are below the vortex core switching field.

SUMMARY

The present disclosure concerns a magnetoresistive element for sensing an external magnetic field, comprising a tunnel barrier layer sandwiched between a ferromagnetic reference layer having a pinned reference magnetization, and a ferromagnetic sense layer having a sense magnetization that can be freely oriented in the external magnetic field. The reference, tunnel barrier, and sense layers are stacked perpendicular to a layer plane thereof. The reference magnetization is oriented substantially perpendicular to the layer plane, and the sense magnetization is oriented substantially parallel to the layer plane. At least a portion of the magnetoresistive element has an annular cross-section in the layer plane forming an interior part and an exterior part of said at least a portion, the interior part having an inner diameter and the exterior part having an outer diameter. Said at least a portion comprises the sense layer, the sense magnetization having a closed flux path configuration being orientable either in the clockwise or counterclockwise direction. The inner diameter is larger than 300 nm, and a difference between the inner and outer diameters is greater than 150 nm.

The present disclosure further concerns a magnetoresistive sensor device comprising a plurality of the magnetoresistive elements, wherein the magnetoresistive elements are electrically connected in series or in parallel.

The magnetoresistive element disclosed herein has no hysteresis. The magnetoresistive element can work in external magnetic fields above the vortex core switching field, thus has an extended magnetic field measuring working range.

BRIEF DESCRIPTION

Figure 2:
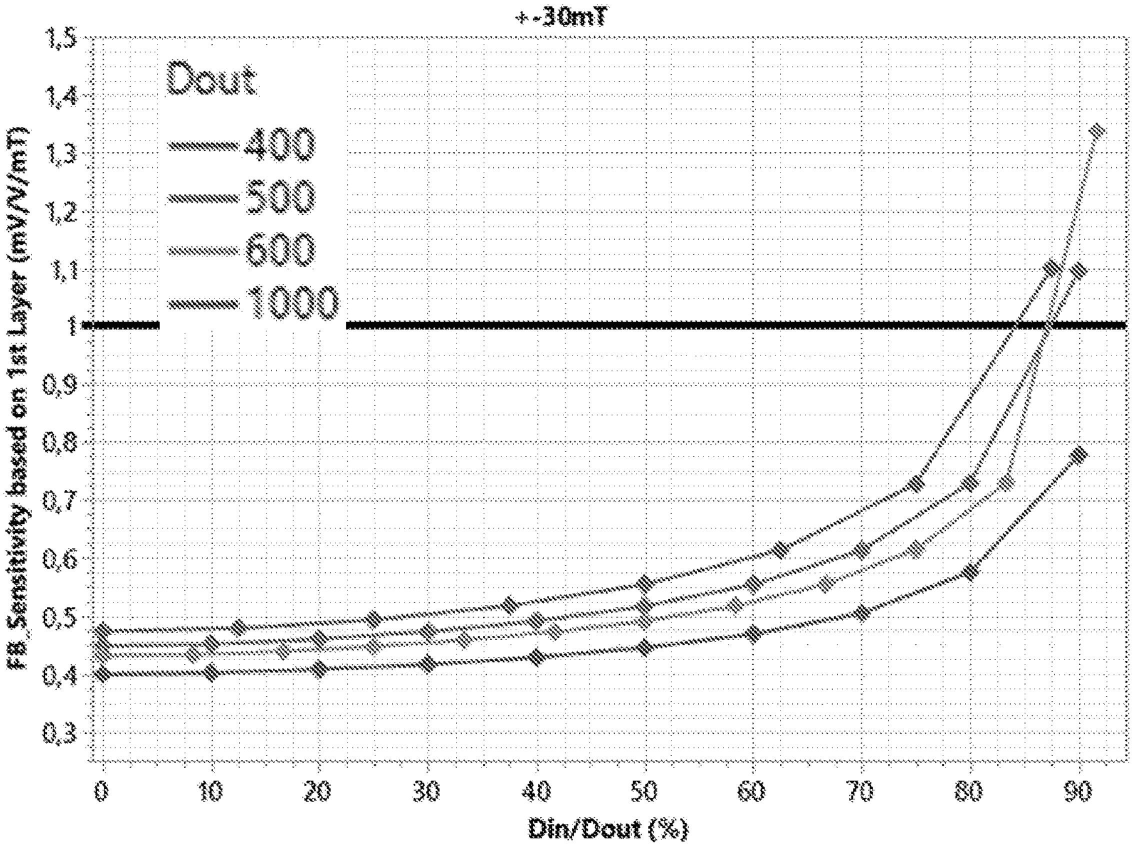
Figure 4:
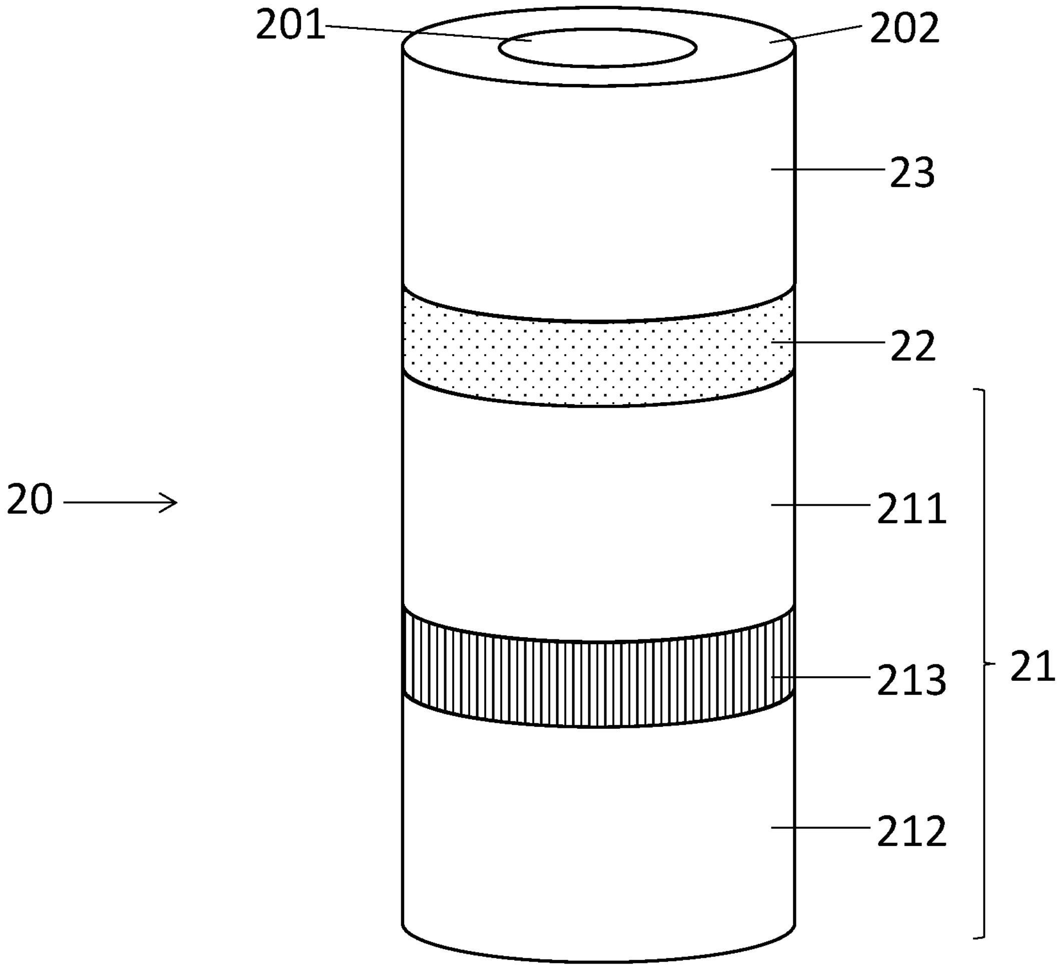
Figure 5:
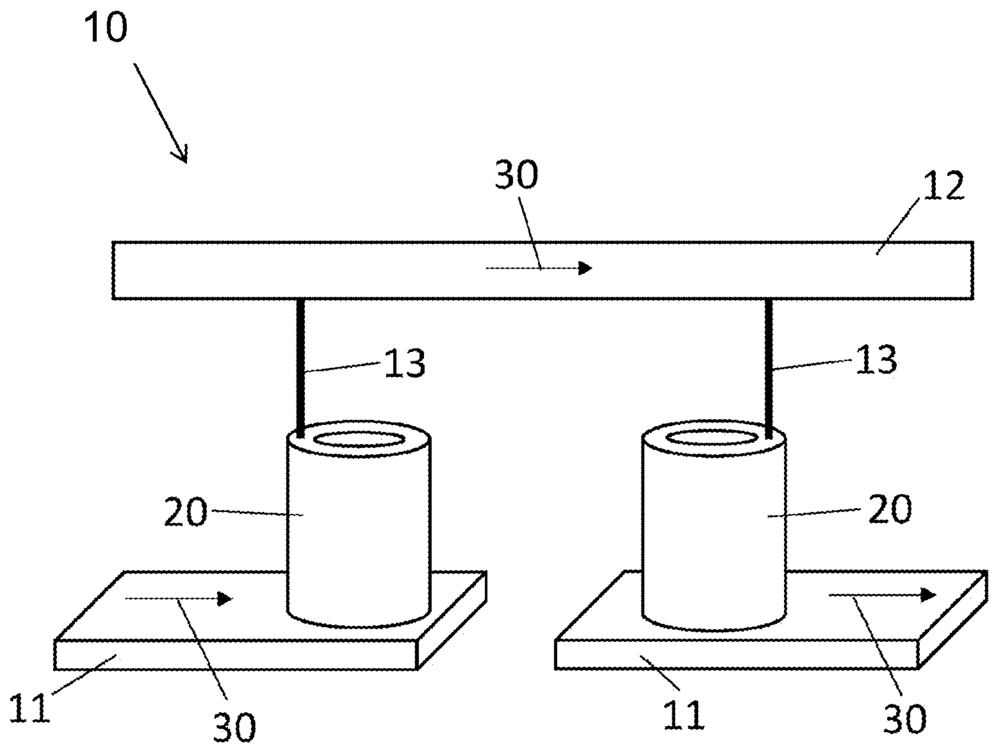

Exemplar embodiments are disclosed in the description and illustrated by the drawings in which:

FIG. 1 illustrates a magnetoresistive element comprising a reference layer, a tunnel barrier layer, and a sense layer, and having an annular cross-section with an inner diameter and outer diameter, according to an embodiment;

FIG. 2 reports the magnetic sensitivity as a function of the ratio of the inner diameter to the outer diameter of the magnetoresistive element;

FIGS. 3*a*-3*c* show different possible geometries of the magnetoresistive element, according to possible embodiments;

FIG. 4 shows the reference layer of the magnetoresistive element, according to an embodiment; and FIG. 5 illustrates a magnetoresistive sensor device comprising a plurality of the magnetoresistive elements, according to an embodiment.

DETAILED DESCRIPTION

FIG. 1 illustrates a magnetoresistive element 20, according to an embodiment. The magnetoresistive element 20 can comprise a magnetic tunnel junction. In particular, the magnetoresistive element 20 can comprise a reference layer 21 having a fixed reference magnetization 210, a sense layer 23 having a free sense magnetization 230 and a tunnel barrier layer 22 between the reference layer 21 and the sense layer 23. The sense magnetization 230 comprises a vortex configuration substantially parallel to the plane of the sense layer 23 in the absence of an external magnetic field 60.

As shown in FIG. 1, the reference layer 21, tunnel barrier layer 22 and sense layer 23 are stacked perpendicular to a layer plane $P_L$ in which the layers 21, 22, 23 extend. Preferably, the reference layer 21 has a perpendicular magnetic anisotropy (PMA) such that the reference magnetization 210 is oriented substantially perpendicular to the layer plane $P_L$.

In an embodiment, at least a portion of the magnetoresistive element 20 has an annular cross-section in the layer plane $P_L$. The portion of the magnetoresistive element 20 thus has an interior part 201 and an exterior part 202. The interior part 201 can be void or comprise an insulating material. The magnetoresistive element 20 has an inner diameter $D_{int}$ and outer diameter $D_{out}$. In one aspect, the portion comprises the sense layer 23. In this configuration, the tunnel barrier 22 and the reference layer 21 do not have an annular cross-section. The interior part 201 extending only along the sense layer 23 thickness is shown in FIG. 1 by the dashed line. Due to the annular shape of the sense layer 23, the sense magnetization 230 has a closed flux path configuration that is orientable either in the clockwise or counterclockwise direction. The closed flux path configuration of the sense magnetization 230 can be considered having a vortex configuration without vortex core.

Preferably, the sense magnetization 230 has a magnetic vector having a fixed orthogonal direction z that is substantially perpendicular to the layer plane $P_L$. Thus, the closed flux path configuration of the sense magnetization 230 can measure a Z-axis component of an external magnetic field, i.e., a component perpendicular to the layer plane $P_L$. In other words, the magnetoresistive element 20 has an OOP sensitivity axis. In normal operation of the magnetoresistive element 20, the magnetic vector of the sense magnetization 230 varies in a first orthogonal direction +z or a second orthogonal direction −z, opposed to the first orthogonal direction +z, depending on the direction and magnitude of the external magnetic field 60 that is substantially perpendicular to the layer plane $P_L$.

In one aspect, the portion of the magnetoresistive element 20 further comprises the sense layer 23 and the reference layer 21. In this configuration, the reference layer 21 does not have an annular crosssection. In another aspect, the portion of the magnetoresistive element 20 can comprise the sense layer 23, the tunnel barrier layer 22 and the reference layer 21.

The performances of the magnetoresistive element 20 depend on its geometry and more particularly, the inner diameter $D_{int}$, the outer diameter $D_{out}$, and the thickness of the magnetoresistive element 20.

FIG. 2 reports the field dependence of the magnetoresistance MRH, measured on the magnetoresistive element 20 for different inner and outer diameters $D_{int}$, $D_{out}$. More particularly, FIG. 2 reports the magnetic sensitivity as a function of the ratio of the inner diameter $D_{int}$ to the outer diameter $D_{out}$. It can be seen that the magnetic sensitivity increases when the ratio of the inner diameter $D_{int}$ to the outer diameter $D_{out}$ is greater than 0.6.

Moreover, an electrical short circuit can be observed in the magnetoresistive element 20 (between the reference layer and the sense layer) when the inner diameter Dint is smaller than 300 nm.

It has been found that that optimum performances of the magnetoresistive element 20 are obtained when the inner diameter $D_{int}$ is larger than 300 nm, and a difference between the inner and outer diameters $D_{int}$, $D_{out}$ is greater than 150 nm.

In one aspect, the outer diameter $D_{out}$ is between 500 nm and 5000 nm. The inner diameter $D_{int}$ is larger than 300 nm and the difference between the inner and outer diameters $D_{int}$, $D_{out}$ is greater than 150 nm. The outer diameter $D_{out}$ equal or smaller the 5000 nm ensures that the sense magnetization 230 has a vortex configuration in the absence of an external magnetic field.

In another aspect, the aspect ratio of the thickness to diameter of the sense layer 23 can be between 0.005 and 2. The aspect ratio between 0.005 and 2 also ensures that the sense magnetization 230 has a vortex configuration in the absence of an external magnetic field.

In some embodiments, the resistance-area-product RA of the magnetoresistive element 20 can be higher than 50 ohm·$\mu m^2$.

FIGS. 3*a* to 3*c* show different possible geometries of the magnetoresistive element 20 within the scope of the disclosure. More particularly, FIG. 3*a* shows the magnetoresistive element 20 where the interior part 201 has a substantially circular shape. FIG. 3*b* shows the magnetoresistive element 20 where the interior part 201 has an elliptical shape. In the geometries of FIGS. 3*a* and 3*b*, the interior part 201 is substantially concentric with the exterior part 202. FIG. 3*c* shows the magnetoresistive element 20 where the interior part 201 is nonconcentric with the exterior part 202.

The reference and sense layers 21, 23 can comprise, or be formed of, a ferromagnetic material such as a cobalt ("Co"), iron ("Fe") or nickel ("Ni") based alloy and preferentially a CoFe, NiFe or CoFeB based alloy. The sense layer 21 should have a thickness that is greater than 15 nm. The reference and sense layers 21, 23 can comprise a multilayer structure where each layer can include a ferromagnetic material such as a Co, Fe or Ni based alloy and preferentially a CoFe, NiFe or CoFeB based alloy, and non-magnetic layers such as Ta, Ti, W, Ru, Ir.

In a possible configuration of the magnetoresistive element 20 shown in FIG. 4, the reference layer 21 can comprise a synthetic antiferromagnetic (SAF) structure including a first reference sublayer 211 in contact with the tunnel barrier layer 22 and a second reference sublayer 212 separated from the first reference sublayer 211 by a coupling layer 213, wherein the coupling layer 213 antiferromagnetically couples the first reference sublayer 211 to the second reference sublayer 212. Each of the first and second reference sublayer 211, 212 has a PMA such that a reference magnetization 210 is oriented substantially perpendicular to the plane of the first and second reference sublayer 211, 212 and in opposite directions.

In some embodiments not represented, the sense layer 23 comprises a SAF sense layer. In particular, the sense layer 23 comprises a first sense ferromagnetic layer having a first sense magnetization, and a second sense ferromagnetic layer having a second sense magnetization.

The magnetization of the two sense ferromagnetic layers can be coupled in an anti-parallel direction due to the presence of an anti-parallel coupling layer.

Figure 3:
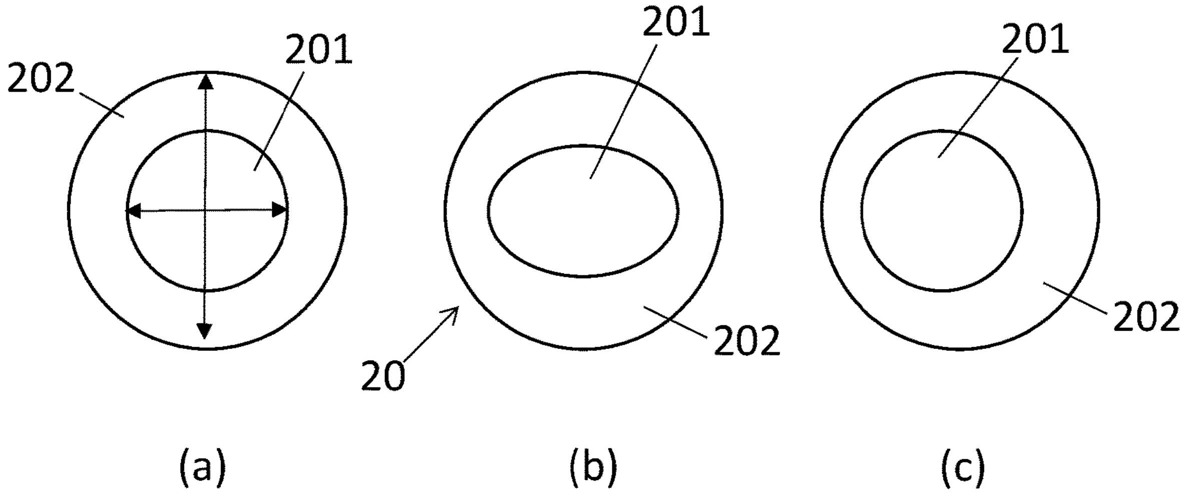

FIG. 5 illustrates a magnetoresistive sensor device 10 comprising a plurality of the magnetoresistive elements 20, according to an embodiment. FIG. 5 shows only two magnetoresistive elements 20 but it should be understood that the magnetoresistive sensor device 10 can comprises more the two magnetoresistive elements 20. The magnetoresistive elements 20 can be electrically connected in series or in parallel. In the example of FIG. 3, the magnetoresistive elements 20 are electrically connected in series. In particular, one end of the magnetoresistive element 20 is connected to a first electrical connector 11 and the other end of the magnetoresistive element 20 is connected to a second electrical connector 12, for example through a via 13.

The magnitude of the external magnetic field 60 in the +z, −z direction can be measured by passing a sense current 30 in the magnetoresistive elements 20 of the magnetoresistive sensor device 10, through the first and second electrical connectors 11, 12 and the vias 13. The magnitude of the sense current 30 varies with the conductance (or resistance) of the magnetoresistive elements 20. The latter depends on the relative orientation of the sense magnetization 230 relative to the orientation of the reference magnetization 210 (see FIG. 1).

Having described exemplary embodiments of the disclosure, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

REFERENCE NUMBERS AND SYMBOLS

10 magnetoresistive sensor device
11 first electrical connector
12 second electrical connector
13 via
2 magnetoresistive sensor element
20 magnetic tunnel junction
201 interior part
202 exterior part
21 reference layer
210 reference magnetization
211 first reference sublayer
212 second reference sublayer
213 coupling layer
22 tunnel barrier layer
23 sense layer
230 sense magnetization
30 sense current
60 external magnetic field
$D_{int}$ inner diameter
$D_{out}$ outer diameter
$P_L$ layer plane
Z orthogonal direction
+Z first orthogonal direction
−z second orthogonal direction

What is claimed is:

1. A magnetoresistive element for sensing an external magnetic field, comprising:

a tunnel barrier layer sandwiched between a ferromagnetic reference layer having a pinned reference magnetization, and a ferromagnetic sense layer having a sense magnetization that can be freely oriented in the external magnetic field;

wherein the reference, tunnel barrier, and sense layers are stacked perpendicular to a layer plane thereof;

wherein the reference magnetization is oriented substantially perpendicular to the layer plane, and the sense magnetization is oriented substantially parallel to the layer plane;

wherein at least a portion of the magnetoresistive element has an annular cross-section in the layer plane forming an interior part and an exterior part of said at least a portion, the interior part having an inner diameter and the exterior part having an outer diameter;

wherein said at least a portion comprises the sense layer, and wherein the sense magnetization has a closed flux path configuration being orientable either in the clockwise or counterclockwise direction; and wherein the inner diameter being larger than 300 nm, and a difference between the inner and outer diameters is greater than 150 nm.

2. The magnetoresistive element according to claim 1, wherein said at least a portion further comprises the reference layer.

3. The magnetoresistive element according to claim 1, wherein said at least a portion further comprises the tunnel barrier layer.

4. The magnetoresistive element according to claim 1, wherein the outer diameter is between 500 nm and 5000 nm.

5. The magnetoresistive element according to claim 1, wherein the sense layer has a thickness greater than 15 nm.

6. The magnetoresistive element according to claim 1, wherein the aspect ratio of the thickness to diameter of the sense layer is between 0.005 and 2.

7. The magnetoresistive element according to claim 1, wherein the resistance-area-product (RA) of the magnetoresistive element is higher than 50 ohm·$\mu m^2$.

8. The magnetoresistive element according to claim 1, wherein the interior part has a substantially circular shape.

9. The magnetoresistive element according to claim 1, wherein the interior part has a substantially elliptical shape.

10. The magnetoresistive element according to claim 1, wherein the interior part is nonconcentric with the exterior part.

11. A magnetoresistive sensor device comprising a plurality of the magnetoresistive elements according to claim 1, wherein the magnetoresistive elements are electrically connected in series or in parallel.

* * * * *